(12) United States Patent
Mossavat et al.

(10) Patent No.: US 11,392,043 B2
(45) Date of Patent: Jul. 19, 2022

(54) METHOD AND METROLOGY APPARATUS FOR DETERMINING ESTIMATED SCATTERED RADIATION INTENSITY

(71) Applicant: ASML Netherlands B.V., Veldhoven (NL)

(72) Inventors: Seyed Iman Mossavat, Waalre (NL); Remco Dirks, Deurne (NL); Hendrik Jan Hidde Smilde, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 405 days.

(21) Appl. No.: 16/539,208

(22) Filed: Aug. 13, 2019

(65) Prior Publication Data

US 2020/0057386 A1 Feb. 20, 2020

(30) Foreign Application Priority Data

Aug. 15, 2018 (EP) .................................... 18189181

(51) Int. Cl.
*G03F 7/20* (2006.01)
*G01N 23/20066* (2018.01)
*G01N 23/201* (2018.01)

(52) U.S. Cl.
CPC ....... *G03F 7/70625* (2013.01); *G01N 23/201* (2013.01); *G01N 23/20066* (2013.01); *G03F 7/705* (2013.01); *G03F 7/70633* (2013.01)

(58) Field of Classification Search
CPC .. G03F 7/70625; G03F 7/705; G03F 7/70633; G03F 7/70491; G03F 7/70483–70541; G03F 7/70608–70683; G03F 7/7085; G01N 23/20066; G01N 23/201

USPC ...... 355/18, 30, 52–55, 67–77, 133; 430/22, 430/30; 356/399–401, 300–334, 356/364–370, 601–613, 614–624, 356/625–640
See application file for complete search history.

(56) References Cited

U.S. PATENT DOCUMENTS

| | | | |
|---|---|---|---|
| 7,738,103 B2 | 6/2010 | Kiers et al. | |
| 8,731,882 B2 | 5/2014 | Van Beurden | |
| 8,812,277 B2 | 8/2014 | Li | |

(Continued)

OTHER PUBLICATIONS

International Search Report and Written Opinion of the International Searching Authority directed to related International Patent Application No. PCT/EP2019/069956, dated Sep. 30, 2019; 12 pages.

*Primary Examiner* — Christina A Riddle
(74) *Attorney, Agent, or Firm* — Sterne, Kessler, Goldstein & Fox P.L.L.C.

(57) ABSTRACT

A method of determining an estimated intensity of radiation scattered by a target illuminated by a radiation source, has the following steps: obtaining and training (402) a library REFLIB of wavelength-dependent reflectivity as a function of the wavelength, target structural parameters and angle of incidence $R(\lambda,\theta,x,y)$; determining (408) a wide-band library (W-BLIB) of integrals of wavelength-dependent reflectivity R of the target in a Jones framework over a range of radiation source wavelengths $\lambda$; training (TRN) (410) the wide-band library; and determining (412), using the trained wide-band library, an estimated intensity (INT) of radiation scattered by the target illuminated by the radiation source.

7 Claims, 5 Drawing Sheets

(56) References Cited

U.S. PATENT DOCUMENTS

| | | |
|---|---|---|
| 8,838,422 B2 | 9/2014 | Li et al. |
| 9,310,296 B2 | 4/2016 | Dziura et al. |
| 2009/0135424 A1 | 5/2009 | Kiers et al. |
| 2011/0218789 A1* | 9/2011 | Van Beurden ...... G03F 7/70625 703/13 |
| 2011/0246141 A1 | 10/2011 | Li |
| 2013/0148130 A1* | 6/2013 | Li ...................... G01N 21/9501 356/601 |
| 2017/0357115 A1 | 12/2017 | Jeon et al. |
| 2017/0357155 A1 | 12/2017 | Quintanilha et al. |

\* cited by examiner

METHOD AND METROLOGY APPARATUS FOR DETERMINING ESTIMATED SCATTERED RADIATION INTENSITY

FIELD OF THE INVENTION

The present invention relates to methods and metrology apparatuses for determining an estimated intensity of radiation scattered by a target illuminated by a radiation source. The methods and metrology apparatus are usable, for example, in the manufacture of devices by lithographic techniques.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

For various reasons, e.g., to maximize space on the wafer, targets are becoming increasingly smaller. As targets shrink, it is becoming difficult to ensure sufficient illumination (e.g., number of photons per measurement) to ensure good measurement quality and signal-to-noise characteristics. The smaller the targets, the fewer photons there will be incident on the target per second, and as such measurement time increases.

Conventional angle-resolved scatterometers, particularly those using visible radiation, use a narrow-band filter at the radiation source of typically 10 nm bandwidth to limit the matching issue due to variation across the population of radiation sources and color filters. The measurement target response is represented by a complex reflectivity matrix that may be calculated by an electromagnetic (EM) solver. Such an EM solver is disclosed in US Patent U.S. Pat. No. 8,731,882B2. Another type of EM solver uses rigorous coupled wave analysis (RCWA). During high-volume manufacturing deployment, libraries may be used to replace EM solvers. During recipe (scatterometer settings) set-up the EM solver itself is has been used. The measured intensity can be estimated via the Jones framework, that maps the complex reflectivity matrix, and outgoing and incoming optic matrices, into an intensity value by a trace operation.

The complex reflectivity matrix is conventionally calculated at the single illumination wavelength of the filtered radiation source, which is the center of the bandwidth.

Even for a scatterometer using a relatively narrow 10 nm-wide radiation source bandwidth, if the variation of target response over this range is nonlinear, the center frequency is not representative of the average response.

Using a narrower bandwidth is not acceptable because it reduces the number of photons available, so measurement time is increased and throughput is decreased. Actually, there is a motivation to use a wider bandwidth, to improve throughput (TPT) in scatterometers that use a small spot size on the target. In such scatterometers, higher integration time is required to reach sufficient signal-to-noise ratio (SNR). A wide-band radiation source is also expected to improve measurement accuracy.

However, calculations of the complex reflectivity matrix for scatterometers using wide-band radiation source illumination would take too much time and computing resource. There is a problem characterizing the radiation source spectrum, and calculating the intensity, fast enough during the move-acquire-measure (MAM) cycle.

SUMMARY OF THE INVENTION

The invention in a first aspect provides a method of determining an estimated intensity of radiation scattered by a target illuminated by a radiation source, the method comprising,
  determining a wide-band library of integrals of wavelength-dependent reflectivity of the target in a Jones framework over a range of radiation source wavelengths;
  training the wide-band library; and
  determining, using the trained wide-band library, an estimated intensity of radiation scattered by the target illuminated by the radiation source.

The invention in a second aspect provides a metrology apparatus comprising:
  a radiation source operable to provide illumination; and
  a processor operable to perform the method of the first aspect.

The invention in a third aspect provides a computer program product containing one or more sequences of machine-readable instructions for determining an estimated intensity of radiation scattered by a target illuminated by a radiation source, the instructions being adapted to cause one or more processors to perform a method according to the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
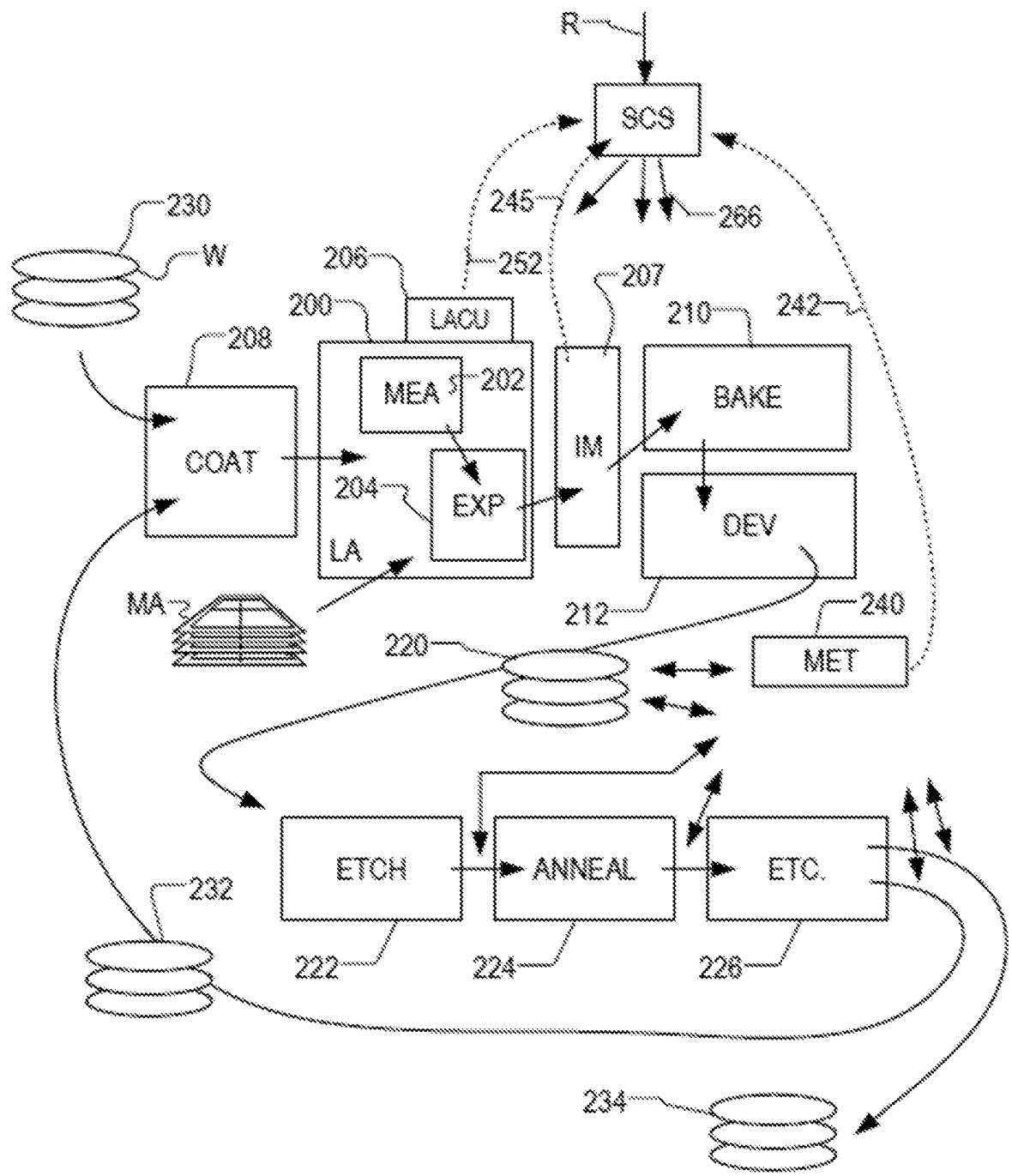
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc.. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which litho cell LC is located may also include one or more metrology systems. The metrology systems may include a stand-alone metrology apparatus MET 240 and /or an integrated metrology apparatus IM 207. The stand-alone metrology apparatus MET 240 receives some or all of the substrates W that have been processed in the litho cell for performing measurements offline. The integrated metrology apparatus IM 207 performs inline measurements and is integrated into the track to receive and measure some or all of the substrates W immediately after exposure. Metrology results are provided directly or indirectly to the supervisory control system (SCS) 238. If errors are detected, adjustments may be made to exposures of subsequent substrates, especially if the metrology can be done soon and fast enough that other substrates of the same batch are still to be exposed.

A common example of a metrology apparatus in a modern lithographic production facility is a scatterometer, for example an angle-resolved scatterometer or a spectroscopic scatterometer, and it may normally be applied to measure properties of the developed substrates at 220 prior to etching in the apparatus 222. Using stand-alone metrology apparatus 240 and/or integrated metrology apparatus 207, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 2A:
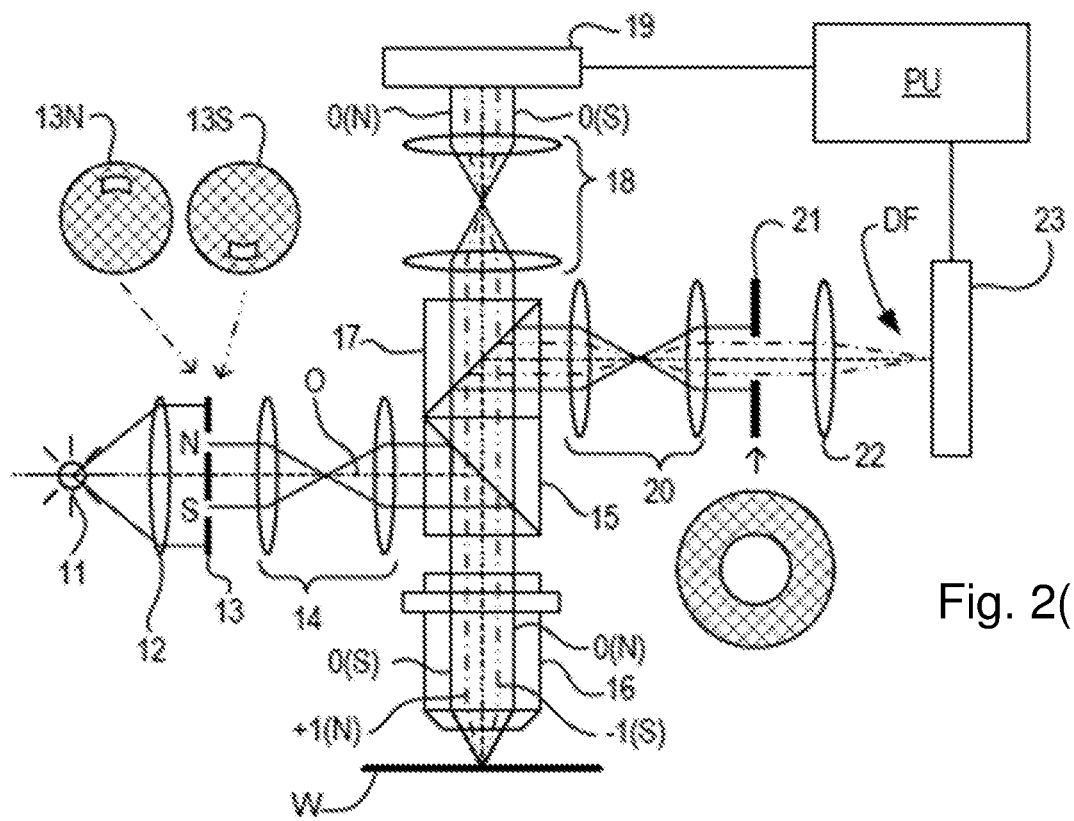
FIGS. 2(a)-2(b) comprise 2(a) a schematic diagram of a dark field scatterometer for use in measuring targets using a first pair of illumination apertures, 2(b) a detail of diffraction spectrum of a target grating for a given direction of illumination.

A metrology apparatus is shown in FIG. 2(a). The stand-alone metrology apparatus 240 and/or the integrated metrology apparatus 207 may comprise such a metrology apparatus, for example, or any other suitable metrology apparatus. A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 2B:
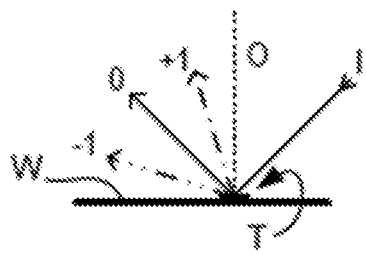

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

In some cases, a metrology apparatus may allow selection of the wavelength(s) and/or bandwidth of the measurement radiation. This facility is typically used to optimize the wavelength used to increase measurement sensitivity, as measurement sensitivity typically varies with wavelength on a stack-by-stack basis (often referred to as a swing curve). Typically, the bandwidth of the measurement radiation is maintained fairly or very narrow. Broader bandwidths are known to have an adverse effect on the measurement quality and therefore a negative impact on the measurement accuracy.

Metrology is being typically performed on targets which are decreasing in size; e.g., to 10 μm by 10 μm or 5 μm by 5 μm (or even smaller). This may be done for a number of reasons, for example, so that the targets can be positioned in amongst product features, rather than in the scribe lane and to minimize the area they occupy on a reticle or wafer. Such targets can be larger (underfilled measurement) or smaller (overfilled measurement) than the illumination spot and may be surrounded by product structures on a wafer. Such targets can comprise multiple gratings which can be measured in one image. However, as targets decrease in size, throughput becomes an issue. The time it takes to perform a complete measurement is often referred to as the move-acquire-measure (MAM) time. The acquisition part of this MAM time will depend on, inter alfa, the number of photons per second (photon rate) incident on the target (in addition to other parameters such as the transmission of the sensor and diffraction efficiency of the grating). As target size decreases (e.g., to 5 μm² or smaller), the photon rate also decreases, all else being equal (e.g., for a given illumination intensity and bandwidth), because an increasingly small illumination spot is used to fit within the small targets. In a typical arrangement, to achieve sufficient signal-to-noise characteristics in the pupil image, the number of photons available for a measurement may be increased by increasing the integration time, leading to higher MAM time and lower throughput.

Methods to address this issue may comprise increasing the overall intensity (brightness) of the source, improved transmission of the optics directing the measurement radiation to and from the target, or increasing the camera efficiency. However, none of these solutions are simple or trivial to implement, as they require significant expenditure and hardware change.

Therefore, it is proposed to increase the photons available for a measurement (photon rate) by increasing the bandwidth of the measurement radiation to a range of radiation source wavelengths. In specific embodiments, the range of radiation source wavelengths may have a bandwidth broader than 10 nm, a bandwidth broader than 15 nm, a bandwidth broader than 20 nm, a bandwidth broader than 30 nm, or a bandwidth in the range of 20 nm to 50 nm.

Libraries may be built to model reflectivity. In this disclosure, we show that by inspecting the Jones framework, it is possible to use reflectivity libraries to build wide-band libraries for the integral of reflectivity over the wavelength range of the radiation source.

We calculate the intensities using a Jones matrix formalism described by the following equation for calculated intensity $I_{calc}$, which uses a Jones framework:

$$I_{calc} = Tr\left[M_{out} \sum_o R_o \rho_{in} R_o^H\right]$$

where the summation is taken over diffraction orders, o. Tr is the matrix trace operation, $M_{out}$ is the output optics Jones matrix that characterises the optics for a particular pixel. $\rho_{in}$ characterises the incoming beam and source. A pixel in an angularly resolved scatterometer corresponds to an angle of incidence range. Each pixel has two matrices, $M_{out}$ and $\rho_{in}$, which are 2×2 complex matrices. $M_{out}$ and $\rho_{in}$ are calibrated from measurements. $R_o$ is a complex reflectivity matrix representing the reflectivity response of the target structure (stack) for a certain diffraction order o. $R_o$ is typically calculated by an electromagnetic (EM) solver. $R_o^H$ is the Hermitian conjugate of the complex reflectivity matrix $R_o$.

Without loss of generality we assume only $0^{th}$ order is existing. For every order, this operation can be done independently. To compute the wide-band response, we have to integrate this over the wavelength:

$$I_{calc} = \int_{\lambda_0}^{\lambda_1} d\lambda Tr[M_{out} R \rho_{in} R^H]$$

We assume that $M_{out}$ is constant over the bandwidth, then further linear algebraic manipulation produces:

$$I_{calc} = Tr[M_{out} \int_{\lambda_0}^{\lambda_1} d\lambda R(\lambda) \rho_{in}(\lambda) R^H(\lambda)]$$

The source spectrum is captured via $\rho_{in}(\lambda)$.

We show in the appendix that:

$$I_{calc} = vec(M_{out})^T \int_{\lambda_0}^{\lambda_1} d\lambda ((R^H(\lambda))^T \otimes R(\lambda)) vec(\rho_{in}(\lambda))$$

where the vec operator is $$vec\left(\begin{bmatrix} A_{11} & A_{12} \\ A_{21} & A_{22} \end{bmatrix}\right) = \begin{bmatrix} A_{11} \\ A_{21} \\ A_{12} \\ A_{22} \end{bmatrix}$$

and $\otimes$ denotes the Kroneceker product is defined as $$A \otimes B = \begin{bmatrix} A_{11}B & \cdots & A_{1n}B \\ \vdots & \ddots & \vdots \\ A_{m1}B & \cdots & A_{mn}B \end{bmatrix}$$

The libraries may be built as black-box functions (emulators) of the EM solver. This is done by building a reflectivity library, which is an offline model of the reflectivity response of the stack $R(\lambda, \theta, x, y)$ based on optical input/outputs, where stack parameters (e.g. CD, sidewall angle, height) are denoted by $\theta$, pixel location (corresponding to angle of incidence) is denoted by x, y, and wavelength is denoted by $\lambda$.

To account for a wide-band radiation source, it is desirable to efficiently calculate, during high-volume manufacture operation, the integral $$\int_{\lambda_0}^{\lambda_1} d\lambda ((R^H(\lambda))^T \otimes R(\lambda)) vec(\rho_{in}(\lambda))$$

where the reflectivity $R(\lambda, \theta, x, y)$ is a function of the stack, pixel location, and wavelength. The source $vec(\rho_{in}(\lambda))$ is machine dependent, time varying, and wavelength dependent.

Figure 3:
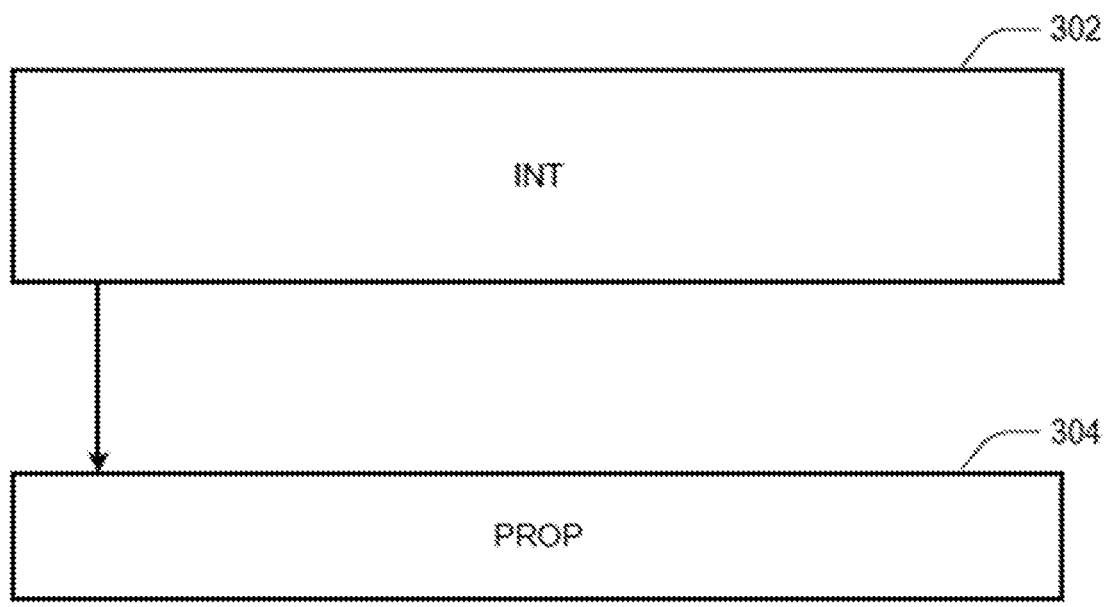
FIG. 3 is a flowchart of a general method of estimating intensity and comparing it with a measured intensity.

FIG. 3 is a flowchart of a general method of estimating intensity and comparing it with a measured intensity. At step 302 intensity (INT) of radiation scattered by a target is estimated. At step 304 a measured intensity is compared to the estimated intensity to determine a property (PROP) of the target, such as a structural property. Embodiments described below with reference to FIGS. 4 and 5 expand relate to the step 302.

Figure 4:
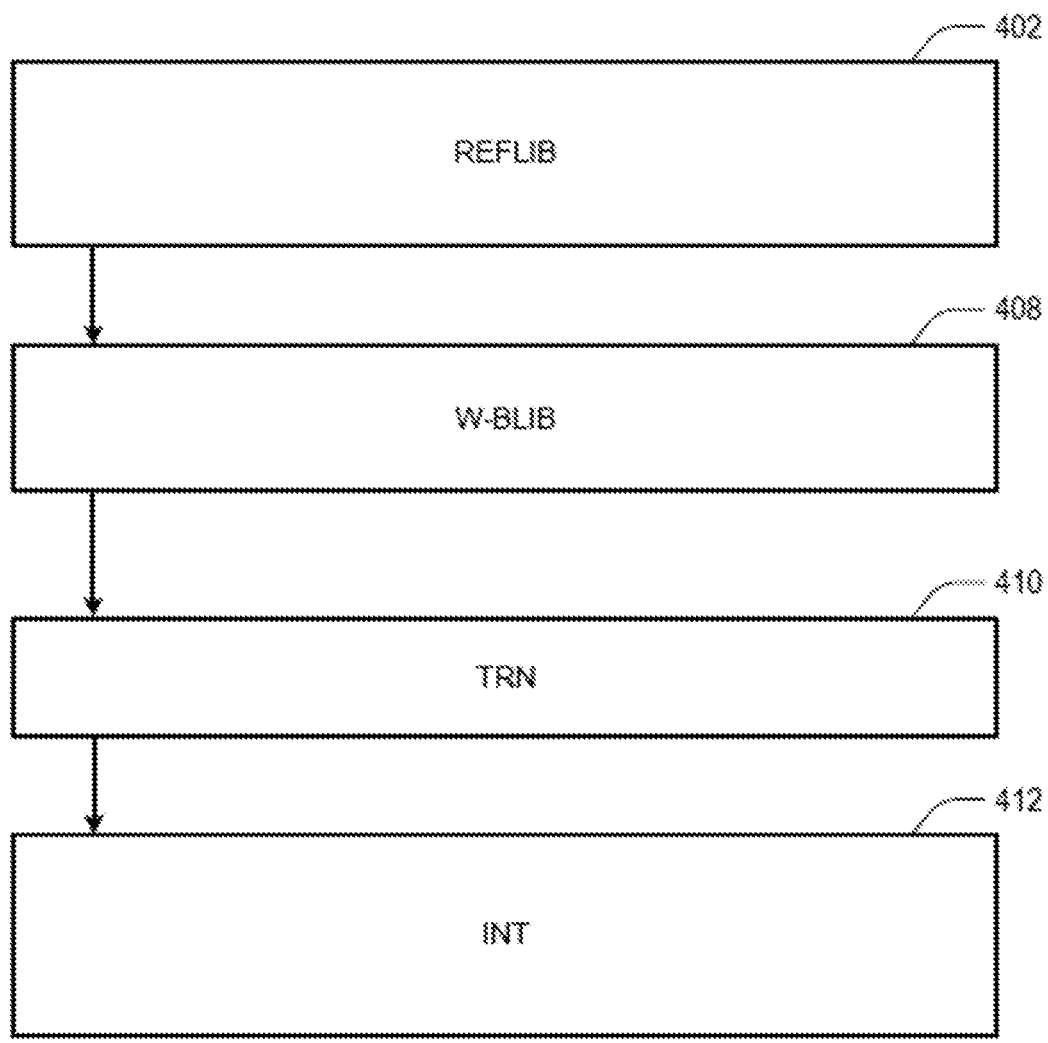
FIG. 4 is a flowchart of a method in accordance with an embodiment of the present invention.

FIG. 4 is a flowchart of a method in accordance with an embodiment of the present invention. The method of determining an estimated intensity of radiation scattered by a target illuminated by a radiation source, has the following steps:

402: Obtaining and training a library (REFLIB) of wavelength-dependent reflectivity as a function of the wavelength, target structural parameters and pixel location (angle of incidence) $R(\lambda,\theta,x,y)$;

408: Determining a wide-band library (W-BLIB) of integrals of wavelength-dependent reflectivity R of the target in a Jones framework over a range of radiation source wavelengths $\lambda$;

410: Training (TRN) the wide-band library; and

412: Determining, using the trained wide-band library, an estimated intensity (INT) of radiation scattered by the target illuminated by the radiation source.

The library $R(\lambda,\theta,x,y)$ and wide-band library may be trained via EM simulations to generate a number of input/output data points (inputs: stack configurations, wavelength, angle of incidence and outputs: reflectivity calculated by the EM solver). Then a regression method (e.g. machine learning methods) may be used to to train a mapping from inputs to outputs. Suitable regression methods include kriging and neural networks.

For the embodiment described below with reference to FIG. 5, we factorize $\rho_{in}(\lambda)$ as:

$$\rho_{in}(\lambda) = k_{AL}(\lambda) k_{Ref}(\lambda) \widehat{\rho_{in}}(\lambda)$$

where $k_{AL}(\lambda)$ is a scalar that is determined by measurements done once per wafer, for handling system drifts, and $k_{Ref}(\lambda)$ is a scalar that is determined by measurements done once per target to capture intensity fluctuations. $\widehat{\rho_{in}}(\lambda)$ is determined based on the measurements at the scatterometer set-up, as discussed below.

We make two assumptions:

(1) The scalar constants are not wavelength dependent, $k_{AL} = k_{AL}(\lambda)$, $k_{Ref} = k_{Ref}(\lambda)$. In other words, the drifts and fluctuations of intensity do not create a large variation in frequency.

(2) $\widehat{\rho_{in}}(\lambda)$ can be characterized during the set-up of the scatterometer or via infrequent calibrations. Thus, a source spectrum $\rho_{in}(\lambda)$ is determined over the range of source wavelengths $\lambda$, and the step of determining the wide-band library comprises using the determined source spectrum $\rho_{in}(\lambda)$. An initial source spectrum $\widehat{\rho_{in}}(\lambda)$ is determined over the range of source wavelengths $\lambda$. Also, wavelength independent scalar constant components $k_{Ref}$, $k_{AL}$ of the source spectrum $\rho_{in}(\lambda)$ over the range of source wavelengths $\lambda$ are determined.

Making those assumptions, it is sufficient to build a library for $$\int_{\lambda_o}^{\lambda_1} d\lambda ((R^H(\lambda))^T \otimes R(\lambda)) \, vec(\widehat{\rho_{in}}(\lambda))$$

However, this library is still machine (scatterometer) dependent. Now we explain how to handle machine dependence.

We measure the $\widehat{\rho_{in}}(\lambda)$ for several machines 1 ... i. Thus, we determine source spectra $\rho_{in}(\lambda)$ over a range of source wavelengths $\lambda$ for a population of sources. We form a basis for these machines such that:

$$\widehat{\rho_{in}^i}(\lambda) = \sum_{j=1}^{m} a_j^i q_j(\lambda)$$

where the basis $\{q_j(\lambda)\}$ expands the space of $\widehat{\rho_{in}}(\lambda)$, and $\widehat{\rho_{in}^i}(\lambda)$ is the calibration on machine i. We may assume that the source spectrum lies on a low dimensional subspace, such as the one calculated by singular-value decomposition (SVD) of all spectra. Thus, by determining a basis $\{q_j(\lambda)\}$ for the population of sources, the source spectrum $\widehat{\rho_{in}^i}(\lambda)$ for a particular metrology apparatus i can be defined as a linear combination of elements of the basis.

After training the reflectivity library $R(\lambda)$, we can build wide-band libraries for $$L_j(\lambda, \theta, x, y) = \int_{\lambda_o}^{\lambda_1} d\lambda ((R^H(\lambda))^T \otimes R(\lambda)) \, vec(q_j(\lambda))$$

Then, the step of training the wide-band library comprises, for each element j=1 ... m in the basis, training a wide-band library $L_j$ defined in terms of the basis $\{q_j(\lambda)\}$.

For a selected metrology apparatus i, the step of determining the estimated intensity uses a linear combination of the trained wide-band libraries $L_j$, thus:

$$I_{calc} = vec(M_{out})^T k_{AL} k_{Ref} \sum_{j=1}^{m} a_j^i L_j(\lambda, \theta, x, y)$$

Note that coefficients $a_j^i$ of the linear combination can be time dependent, to handle the dynamics of the source.

Figure 5:
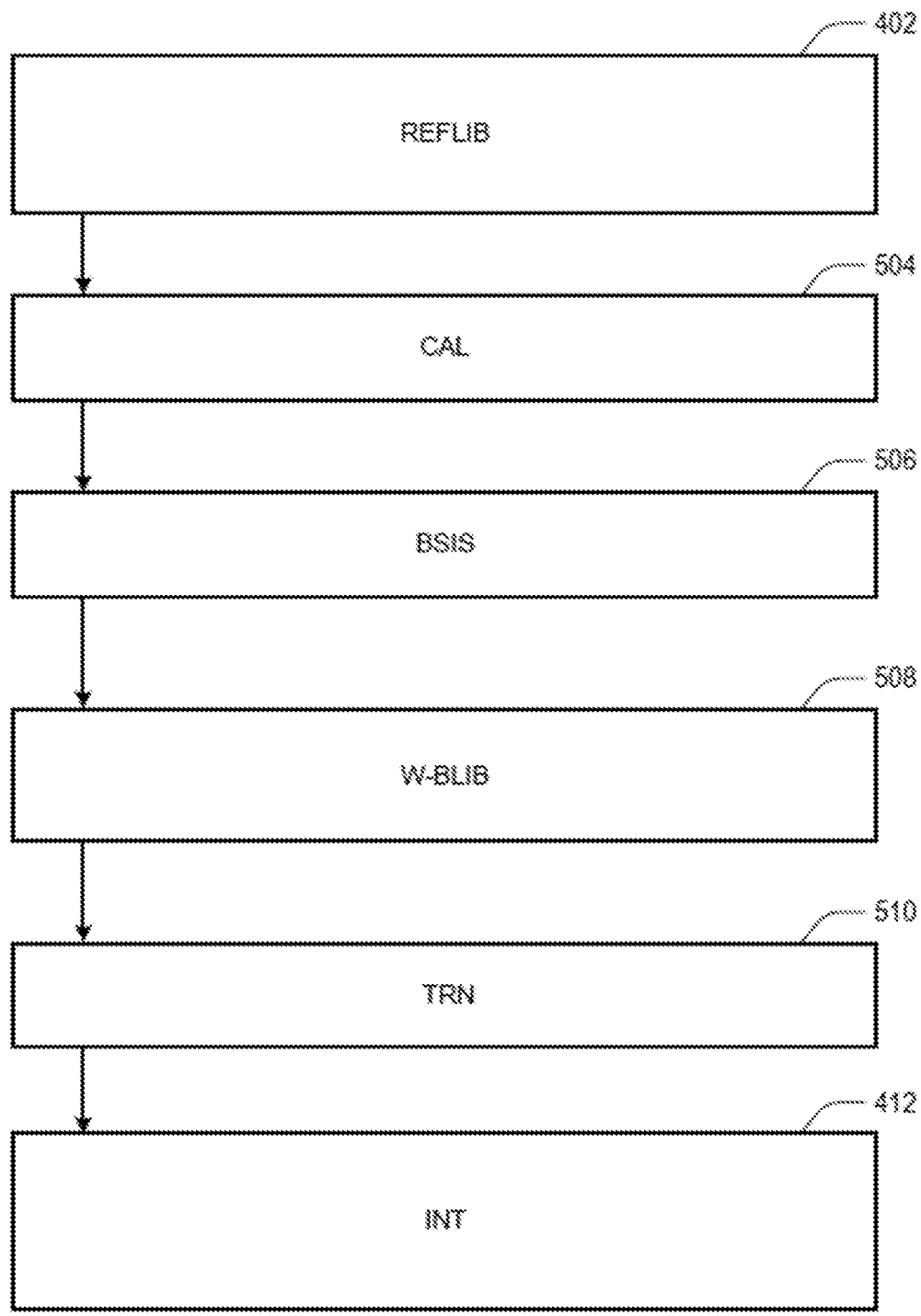
FIG. 5 is a flowchart of a method taking into account a population of sources in accordance with an embodiment of the present invention.

FIG. 5 is a flowchart of a method taking into account a population of sources in accordance with an embodiment of the present invention. The steps are:

402: Obtaining and training a reflectivity library (RE-FLIB) of wavelength-dependent reflectivity as a function of the wavelength, target structural parameters and angle of incidence. The library predicts the reflectivity $R(\lambda,\theta, x, y)$ of a stack as a function of the stack parameters (e.g. CD, sidewall angle, height) $\theta$, pixel location x, y, and wavelength $\lambda$.

504: Calibrating (CAL) source spectra $\rho_{in}(\lambda)$ over a range of source wavelengths $\lambda$ for a population of sources. This involves determining an initial source spectrum $\widehat{\rho_{in}}(\lambda)$ over the range of source wavelengths $\lambda$ and determining the wavelength independent scalar constant components $k_{Ref}$, $k_{AL}$ of the source spectrum $\rho_{in}(\lambda)$ over the range of source wavelengths $\lambda$;

506: Determining a basis $\{q_j(\lambda)\}$ (BSIS) for the population of sources. This allows the source spectrum $\widehat{\rho_{in}^i}(\lambda)$ for a particular metrology apparatus i to be defined as a linear combination of elements of the basis. In other words, the spectra of a new source can be written down as linear a mix of the basis $$\widehat{\rho_{in}^i}(\lambda) = \sum_{j=1}^{m} a_j^i q_j(\lambda);$$

508: Determining a wide-band library (W-BLIB) of integrals of wavelength-dependent reflectivity $R(\lambda)$ of the target in a Jones framework over a range of radiation source wavelengths $\lambda$. For each element j=1 ... m in the basis, a wide-band library $L_j$ is defined in terms of the basis $\{q_j(\lambda)\}$ $$L_j(\lambda, \theta, x, y) = \int_{\lambda_o}^{\lambda_1} d\lambda ((R^H(80))^T \otimes R(\lambda)) \, vec(q_j(\lambda));$$

510: Training (TRN) the wide-band library. This step comprises, for each element j=1 ... m in the basis, training the wide-band library $L_j$ defined in terms of the basis $\{q_j(\lambda)\}$; and

412: Determining, using the trained wide-band library, an estimated intensity (INT) of radiation scattered by the target illuminated by the radiation source:

$$I_{calc} = vec(M_{out})^T k_{AL} k_{Ref} \sum_{j=1}^{m} a_j^i L_j(\lambda, \theta, x, y)$$

Thus, for each machine the source is characterized based on the basis in step 506:

$$\sum_{j=1}^{m} a_j^i L_j(\lambda, \theta, x, y)$$

Coefficients $a_j^i$ of the linear combination are time dependent.

The capability to have one interpolating function across the continuous spectrum of wavelengths allows efficient estimation of intensity of wide-band radiation sources. Embodiments have the advantage of being able to mitigate scatterometer-to-scatterometer matching issues, while using wide-band radiation sources. Quadratic forms are typically more smooth in terms of function behavior, which will likely promote more compact libraries, i.e., fewer samples needed to train the library.

APPENDIX

To prove $$I_{calculated} = vec(M_{out})^T \int_{\lambda_o}^{\lambda_1} d\lambda ((R^H(\lambda)) \, vec(\rho_{in}(\lambda))$$

where the vec operator and the Kroneceker product are defined as:

$$vec\left(\begin{bmatrix} A_{11} & A_{12} \\ A_{21} & A_{22} \end{bmatrix}\right) = \begin{bmatrix} A_{11} \\ A_{21} \\ A_{12} \\ A_{22} \end{bmatrix}$$

-continued $$A \otimes B = \begin{bmatrix} A_{11}B & \cdots & A_{1n}B \\ \vdots & \ddots & \vdots \\ A_{m1}B & \cdots & A_{mn}B \end{bmatrix}$$

we use the following properties of the Kroneceker product and the Vec operator $$Tr[A^TB]=\text{vec}(A)^T\text{vec}(B)$$

$$\text{vec}(A \times B)=(B^T \otimes A)\text{vec}(X)$$

Now we can use the integrated Jones framework in vector format:

$$I_{calc}=Tr[M_{out}\int_{\lambda_o}^{\lambda_1} d\lambda R(\lambda)\rho_{in}(\lambda)R^H(\lambda)]$$

Given that $Tr[A^TB]=\text{vec}(A)^T\text{vec}(B)$ we can write the trace in terms of the vec(·) operator.

$$I_{calc}=\text{vec}(M_{out}^T)^T\text{vec}(\int_{\lambda_o}^{\lambda_1} d\lambda R(\lambda)\rho_{in}(\lambda)R^H(\lambda))$$

Moving the integral out of the vec0 operator gives us $$I_{calc}=\text{vec}(M_{out})^T\int_{\lambda_o}^{\lambda_1} d\lambda \text{vec}(R(\lambda)\rho_{in}(\lambda)R^H(\lambda))$$

Now we use the equality: $\text{vec}(A \times B)=(B^T \otimes A)\text{vec}(X)$ to get:

$$I_{calculated}=\text{vec}(M_{out})^T\int_{\lambda_o}^{\lambda_1} d\lambda((R^H(\lambda)^T \otimes R(\lambda))\text{vec}(\rho_{in}(\lambda))$$

$A_o$

Embodiments may be implemented in a metrology apparatus such as described with reference to FIG. 2, comprising a radiation source 11 operable to provide illumination and a processor PU. The processor PU is then operable to perform a method as described with reference to FIG. 3, FIG. 4 and/or FIG. 5.

Embodiments may be implemented in a computer program product containing one or more sequences of machine-readable instructions for determining an estimated intensity of radiation scattered by a target illuminated by a radiation source, the instructions being adapted to cause one or more processors to perform a method as described with reference to FIG. 3, FIG. 4 and/or FIG. 5.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining an estimated intensity of radiation scattered by a target illuminated by a radiation source and adjusting a process parameter, the method comprising;
   determining, by one or more processors, a wide-band library of integrals of wavelength-dependent reflectivity of the target in a Jones framework over a range of radiation source wavelengths;
   training, by the one or more processors, the wide-band library;
   determining, by the one or more processors, using the trained wide-band library, an estimated intensity of radiation scattered by the target illuminated by the radiation source; and
   using the estimated intensity to increase a bandwidth of the radiation source.

2. The method of claim 1, further comprising:
   determining a source spectrum over the range of source wavelengths, and
   wherein the determining a wide-band library comprises using the determined source spectrum.

3. The method of claim 2, wherein the determining a source spectrum over a range of source wavelengths comprises:
   determining an initial source spectrum over the range of source wavelengths; and
   determining one or more wavelengths independent scalar constant components of the source spectrum over the range of source wavelengths.

4. The method of claim 1, further comprising:
   determining source spectra over a range of source wavelengths for a population of sources;
   determining a basis for the population of sources, such that a source spectrum for a particular metrology apparatus is defined as a linear combination of elements of the basis,
   wherein the training the wide-band library comprises, for each element in the basis, training a wide-band library defined in terms of the basis; and
   for a selected metrology apparatus, the determining the estimated intensity uses a linear combination of the trained wide-band libraries.

5. The method of claim 4, wherein coefficients of the linear combination are time dependent.

6. A metrology apparatus comprising:
   a radiation source operable to provide illumination; and a processor operable to perform a method of determining an estimated intensity of radiation scattered by a target illuminated by a radiation source, the method comprising:
 determining a wide-band library of integrals of wavelength-dependent reflectivity of the target in a Jones framework over a range of radiation source wavelengths;
 training the wide-band library; and
 determining, using the trained wide-band library, an estimated intensity of radiation scattered by the target illuminated by the radiation source.

7. A computer program product containing a non-transitory computer readable medium having one or more sequences of machine-readable instructions for determining an estimated intensity of radiation scattered by a target illuminated by a radiation source, the instructions being adapted to cause one or more processors to perform a method of determining an estimated intensity of radiation scattered by a target illuminated by a radiation source, the method comprising:
 determining, using the one or more processors, a wide-band library of integrals of wavelength-dependent reflectivity of the target in a Jones framework over a range of radiation source wavelengths;
 training, using the one or more processors, the wide-band library; and
 determining, using the one or more processors and the trained wide-band library, an estimated intensity of radiation scattered by the target illuminated by the radiation source,
 wherein the estimated intensity of radiation is used to increase a bandwidth of the radiation source.

* * * * *

UNITED STATES PATENT AND TRADEMARK OFFICE
CERTIFICATE OF CORRECTION

PATENT NO. : 11,392,043 B2
APPLICATION NO. : 16/539208
DATED : July 19, 2022
INVENTOR(S) : Mossavat et al.

It is certified that error appears in the above-identified patent and that said Letters Patent is hereby corrected as shown below:

In the Claims

In Column 14, Lines 23-24, replace "the method comprising;" with --the method comprising:--.

Signed and Sealed this
Eighteenth Day of October, 2022

Katherine Kelly Vidal
*Director of the United States Patent and Trademark Office*